(12) United States Patent
Sharma et al.

(10) Patent No.: US 11,335,789 B2
(45) Date of Patent: May 17, 2022

(54) CHANNEL STRUCTURES FOR THIN-FILM TRANSISTORS

(71) Applicant: Intel Corporation, Santa Clara, CA (US)

(72) Inventors: Abhishek Sharma, Hillsboro, OR (US); Cory Weber, Portland, OR (US); Van H. Le, Portland, OR (US); Sean Ma, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 722 days.

(21) Appl. No.: 16/142,045

(22) Filed: Sep. 26, 2018

(65) Prior Publication Data

US 2020/0098880 A1    Mar. 26, 2020

(51) Int. Cl.
| | |
|---|---|
| *H01L 29/47* | (2006.01) |
| *H01L 29/66* | (2006.01) |
| *H01L 29/45* | (2006.01) |
| *H01L 29/786* | (2006.01) |
| *H01L 27/108* | (2006.01) |

(Continued)

(52) U.S. Cl.
CPC ........ *H01L 29/47* (2013.01); *H01L 27/10805* (2013.01); *H01L 27/2436* (2013.01); *H01L 29/42356* (2013.01); *H01L 29/66742* (2013.01); *H01L 29/786* (2013.01)

(58) Field of Classification Search
CPC ............... H01L 29/47; H01L 27/10805; H01L 27/2436; H01L 29/42356; H01L 29/66742; H01L 29/786; H01L 27/10873; H01L 27/2463; H01L 29/45; H01L 29/78618; H01L 29/66969; H01L 29/7869
See application file for complete search history.

(56) References Cited

U.S. PATENT DOCUMENTS

| | | | |
|---|---|---|---|
| 2004/0026736 A1* | 2/2004 | Grupp | ............... H01L 29/66636 257/330 |
| 2010/0013018 A1 | 1/2010 | Jeon | |
| 2010/0261304 A1 | 10/2010 | Chang | |

(Continued)

FOREIGN PATENT DOCUMENTS

| | | |
|---|---|---|
| CN | 105655410 | 6/2016 |
| JP | S6257252 | 3/1987 |

OTHER PUBLICATIONS

Search Report from Euorpean Patent Application No. 19183098.3, dated Aug. 14, 2020, 9pgs.

*Primary Examiner* — David Vu
(74) *Attorney, Agent, or Firm* — Schwabe, Williamson & Wyatt, P.C.

(57) ABSTRACT

Embodiments herein describe techniques for a thin-film transistor (TFT) above a substrate. The transistor includes a gate electrode above the substrate, and a channel layer above the substrate, separated from the gate electrode by a gate dielectric layer. The transistor further includes a contact electrode above the channel layer and in contact with a contact area of the channel layer. The contact area has a thickness determined based on a Schottky barrier height of a Schottky barrier formed at an interface between the contact electrode and the contact area, a doping concentration of the contact area, and a contact resistance at the interface between the contact electrode and the contact area. Other embodiments may be described and/or claimed.

25 Claims, 8 Drawing Sheets

(51) Int. Cl.
*H01L 27/24* (2006.01)
*H01L 29/423* (2006.01)

(56) References Cited

U.S. PATENT DOCUMENTS

2016/0307919 A1  10/2016  Zhang et al.
2017/0162611 A1   6/2017  Cao
2018/0226463 A1   8/2018  Hsin et al.

\* cited by examiner

CHANNEL STRUCTURES FOR THIN-FILM TRANSISTORS

FIELD

Embodiments of the present disclosure generally relate to the field of integrated circuits, and more particularly, to transistors.

BACKGROUND

A thin-film transistor (TFT) is a kind of field-effect transistor including a channel layer, a gate electrode, and source and drain electrodes, over a supporting but non-conducting substrate. A TFT differs from a conventional transistor, where a channel of the conventional transistor is typically within a substrate, such as a silicon substrate. TFTs have emerged as an attractive option to fuel Moore's law by integrating TFTs vertically in the backend, while leaving the silicon substrate areas for high-speed transistors. TFTs hold great potential for large area and flexible electronics, e.g., displays. Other applications of TFTs may include memory arrays. However, TFTs may have large contact resistances for the contact electrodes, e.g., source electrodes or drain electrodes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
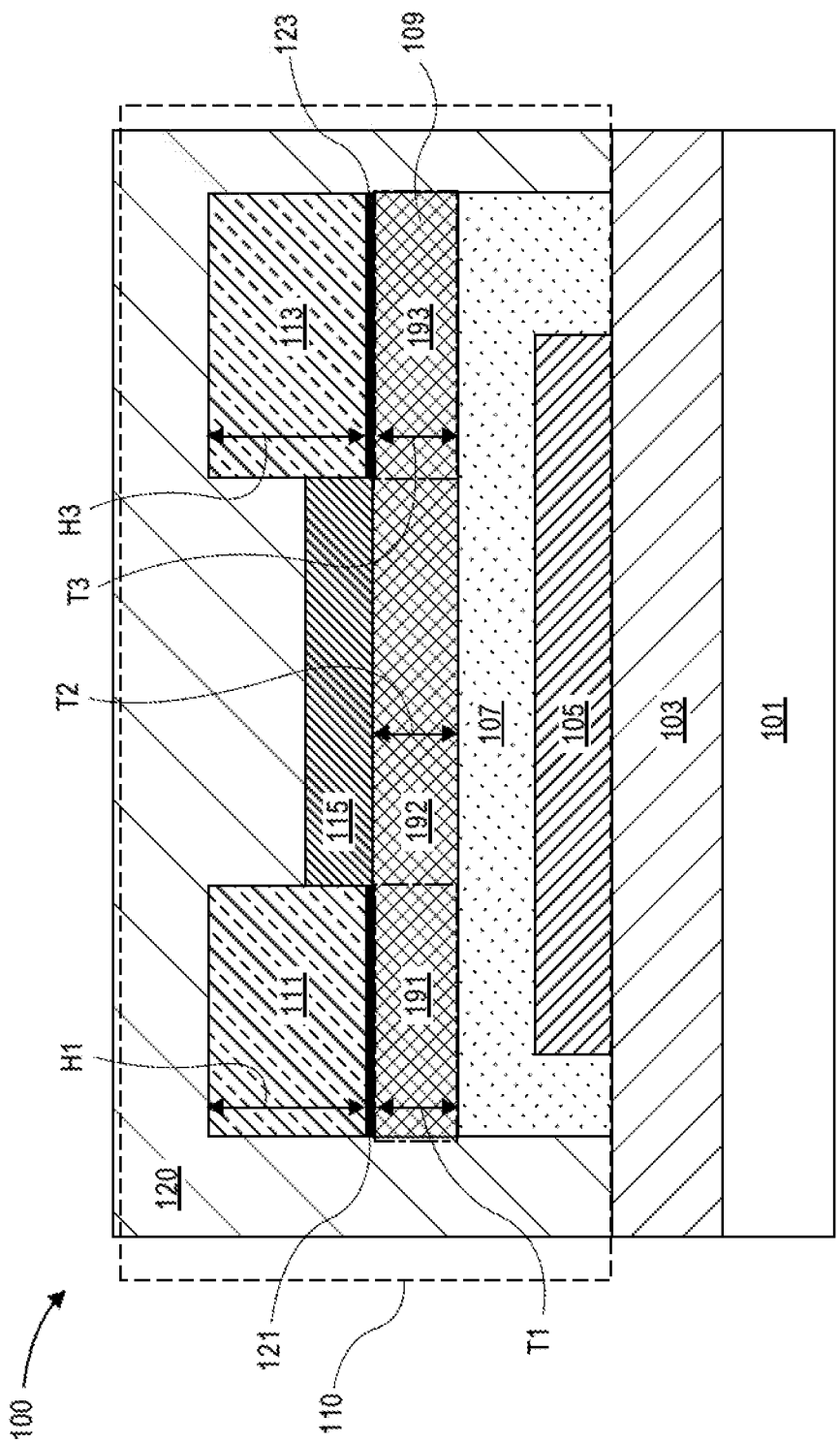
FIGS. 1(a)-1(c) schematically illustrate a diagram of a thin-film transistor (TFT) having a channel layer including a contact area with a thickness related a Schottky barrier height of a Schottky barrier formed at an interface between a contact electrode and the contact area, in accordance with some embodiments.

Thin-film transistors (TFT) have emerged as an attractive option to fuel Moore's law by integrating TFTs in the backend. TFTs may be fabricated in various architectures, e.g., a back-gated or bottom gate architecture, or a top-gate architecture. However, TFTs may typically have high contact resistances for the contact electrodes, e.g., source electrodes or drain electrodes. Common methods to lower the contact resistances for the contact electrodes may rely on the creation of oxygen vacancies, which may come at the expense of short channel degradation due to lateral straggle of the TFTs. Other methods, such as increasing doping concentration of a contact area, metal work function tuning, or Fermi level pinning, may have their own respective limitations. For example, high-level dopants of a contact area of a TFT may diffuse towards a channel area to degrade short channel effects for the TFT. Metals used in the contact electrodes of a TFT with the desired work function may tend to be very reactive to create unwanted reactions for the TFT.

Embodiments herein may improve contact resistances for contact electrodes of a TFT by making a contact area between a contact electrode and a channel layer of a TFT thinner, compared to a normal TFT. Accordingly, such a TFT may be referred to as a thin body TFT compared to a normal or a bulk TFT. A contact area of a channel layer with a contact electrode of a TFT may have a thickness determined based on a Schottky barrier height of a Schottky barrier formed at an interface between the contact electrode and the contact area. In addition, the thickness of the contact area may also depend on a doping concentration of the contact area, and a desired contact resistance at the interface between the contact electrode and the contact area of the channel layer. In some embodiments, a thin body TFT with a thin contact area may have a contact resistance similar to a contact resistance of a bulk TFT with larger body thickness and higher doping concentration, e.g., 10× higher doping, at the bulk channel area. Thin body TFTs may be made using existing contact electrodes and doping processes.

Embodiments herein may present a semiconductor device. The semiconductor device includes a substrate and a transistor above the substrate. The transistor includes a gate electrode above the substrate, and a channel layer above the substrate, separated from the gate electrode by a gate dielectric layer. The transistor further includes a contact electrode above the channel layer and in contact with a contact area of the channel layer. The contact area of the channel layer has a thickness determined based on a Schottky barrier height of a Schottky barrier formed at an interface between the contact electrode and the contact area, a doping concentration of the contact area of the channel layer, and a contact resistance at the interface between the contact electrode and the contact area of the channel layer.

Embodiments herein may present a method for forming a TFT. The method may include: forming a gate electrode above a substrate, and forming a channel layer above the gate electrode and separated from the gate electrode by a gate dielectric layer. The method further includes forming a contact electrode above the channel layer and in contact with a contact area of the channel layer. The contact area of the channel layer has a thickness determined based on a Schottky barrier height of a Schottky barrier formed at an interface between the contact electrode and the contact area, a doping concentration of the contact area of the channel layer, and a contact resistance at the interface between the contact electrode and the contact area of the channel layer.

Embodiments herein may present a computing device, which may include a circuit board, and a memory device coupled to the circuit board and including a memory array. In more detail, the memory array may include a plurality of memory cells. A memory cell of the plurality of memory cells may include a transistor and a storage cell. The transistor in the memory cell may include a source electrode coupled to a bit line of the memory array, a gate electrode above a substrate and coupled to a word line of the memory array, and a drain electrode coupled to a first electrode of the storage cell. A channel layer is above the substrate, separated from the gate electrode by a gate dielectric layer. The source electrode is in contact with a source area of the channel layer. The source area of the channel layer has a source area thickness determined based on a Schottky barrier height of a Schottky barrier formed at an interface between the source electrode and the source area of the channel layer, a doping concentration of the source area of the channel layer, and a contact resistance at the interface between the source electrode and the source area of the channel layer. The drain electrode is in contact with a drain area of the channel layer, where the drain area has a drain area thickness that is same as the source area thickness. In addition, the storage cell further includes a second electrode coupled to a source line of the memory array.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIGS. 1($a$)-1($c$) schematically illustrate a diagram of a TFT 110 having a channel layer 109 including a contact area, e.g., a source area 191, with a thickness related a Schottky barrier height of a Schottky barrier formed at an interface between a contact electrode, e.g., a source electrode 111, and the contact area, in accordance with some embodiments. For clarity, features of the TFT 110, the channel layer 109, the source area 191, and the source electrode 111 may be described below as examples for understanding an example TFT having a channel layer including a contact area with a thickness related a Schottky barrier height of a Schottky barrier formed at an interface between a contact electrode and the contact area. It is to be understood that there may be more or fewer components within a TFT, a channel layer, a contact area, and a contact electrode. Further, it is to be understood that one or more of the components within a TFT, a channel layer, a contact area, and a contact electrode, may include additional and/or varying features from the description below, and may include any device that one having ordinary skill in the art would consider and/or refer to as a TFT, a channel layer, a contact area, and a contact electrode.

In embodiments, an IC 100 includes a substrate 101, an ILD layer 103 above the substrate 101, and the TFT 110 above the substrate 101 and the ILD layer 103. The TFT 110 includes a gate electrode 105 above the substrate 101, a gate dielectric layer 107, the channel layer 109, a passivation layer 115, the source electrode 111, and a drain electrode 113. Either of the source electrode 111 or the drain electrode 113 may be referred to as a contact electrode. The gate electrode 105, the gate dielectric layer 107, the channel layer 109, the source electrode 111, and the drain electrode 123 are within the ILD layer 120 above the substrate 101. The channel layer 109 is above the substrate 101, and separated from the gate electrode 105 by the gate dielectric layer 107. In embodiments, the channel layer 109 is above the gate electrode 105, while in some other embodiments, the channel layer may be below the gate electrode. The passivation layer 115 is between the source electrode 111 and the drain electrode 113.

Figure 2:
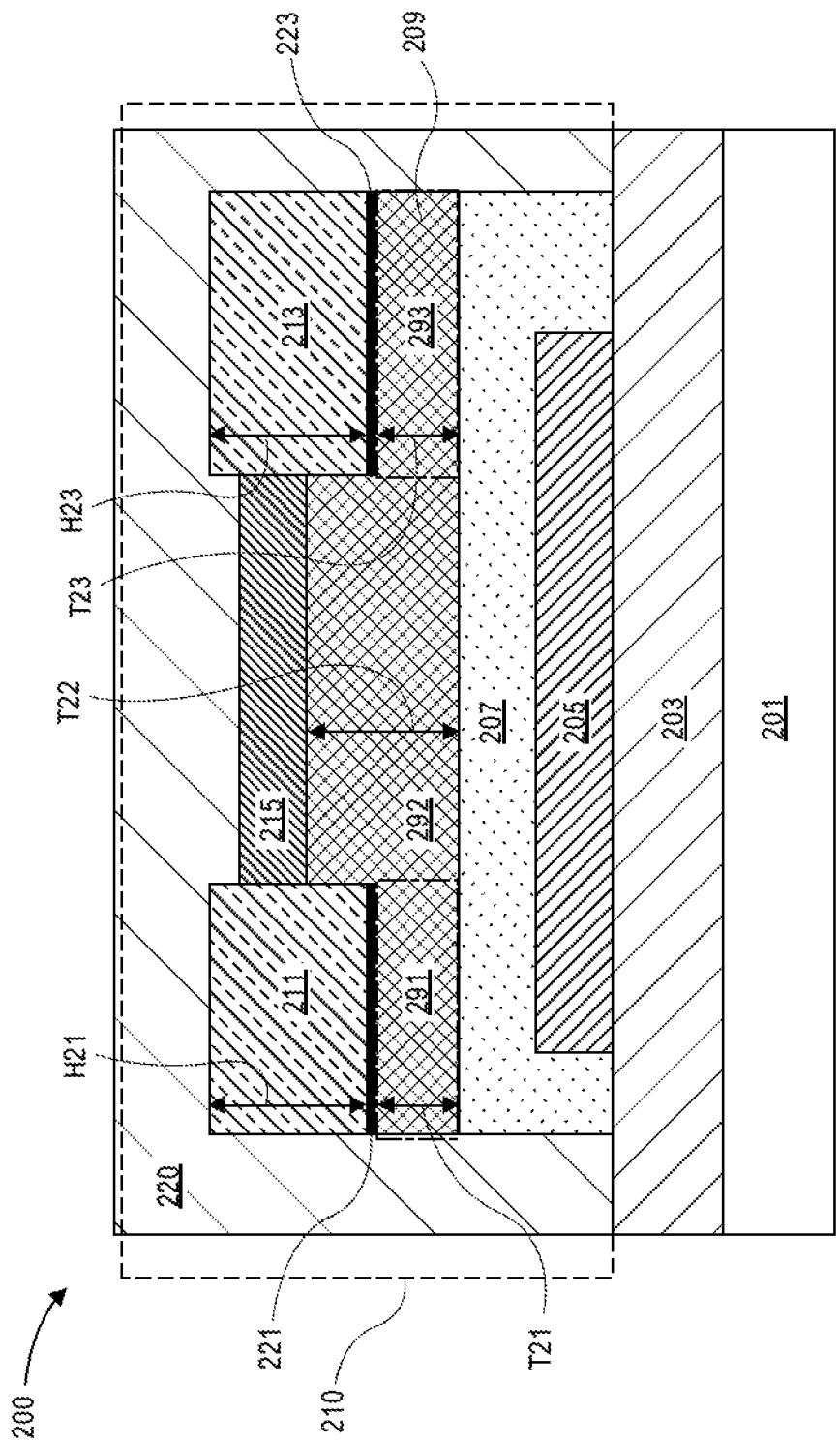
FIG. 2 schematically illustrates a diagram of another TFT having a channel layer including a contact area with a thickness related a Schottky barrier height of a Schottky barrier formed at an interface between a contact electrode and the contact area, in accordance with some embodiments.

In embodiments, the channel layer 109 may be an n-type doped channel or a p-type doped channel. The channel layer 109 includes the source area 191, a channel area 192, and a drain area 193. The source area 191, the channel area 192, or the drain area 193 may be a doped area with a doping concentration. In some embodiments, the doping concentration of the source area 191, the channel area 192, or the drain area 193 may be the same. In some other embodiments, the doping concentration of the source area 191, the channel area 192, or the drain area 193 may be different from each other. The source area 191 may have a thickness T1, the channel area 192 may have a thickness T2, and the drain area 193 may have a thickness T3. In some embodiments, the channel layer 109 may have a thickness throughout the channel layer 109 that is same as the thickness of the contact area of the channel layer. For example, the thickness T1 of the source area 191, the thickness T2 of the channel area 192, and the thickness T3 of the drain area 193, may be the same. In some other embodiments, the channel layer 109 may have the channel area 192 with the thickness T2 that is larger than the thickness of the contact area of the channel layer, as shown in FIG. 2.

In embodiments, a contact electrode is in contact with a contact area of the channel layer 109. For example, the source electrode 111 is in contact with the source area 191 of the channel layer 109. Similarly, the drain electrode 113 is in contact with the drain area 193 of the channel layer 109. The source electrode 111 may have a height H1, and the drain electrode 113 may have a height H3. In some embodiments, the source area 191 may have the thickness T1 smaller than the height H1 of the source electrode 111, and the drain area 193 may have the thickness T3 smaller than the height H3 of the drain electrode 113. For example, the thickness T1 of the source area 191, or the thickness T3 of the drain area 193 may be in a range of about 1 nm to about 10 nm, and the height of a contact electrode, e.g., the height H1 of the source electrode 111, or the height H3 of the drain electrode 113, is higher than 10 nm.

In embodiments, a Schottky barrier is formed at an interface 121 between the source electrode 111 and the source area 191. Similarly, a Schottky barrier is formed at an interface 123 between the drain electrode 113 and the drain area 193. A contact resistance exists at the interface 121 between the source electrode 111 and the source area 191. A contact resistance exists at the interface 123 between the drain electrode 113 and the drain area 193. In designing the TFT 110, the thickness T1 of the source area 191 may be determined based on a Schottky barrier height of the Schottky barrier formed at the interface 121, a doping concentration of the source area 191, and a contact resistance at the interface 121. Similarly, the thickness T3 of the drain area 193 may be determined based on a Schottky barrier height of the Schottky barrier formed at the interface 123, a doping concentration of the drain area 193, and a contact resistance at the interface 123. More details of the relationships between the thickness T1, the Schottky barrier height of the Schottky barrier formed at the interface 121, a doping concentration of the source area 191, and a contact resistance at the interface 121 may be illustrated in FIG. 1(b) and FIG. 1(c).

Figure 1B:
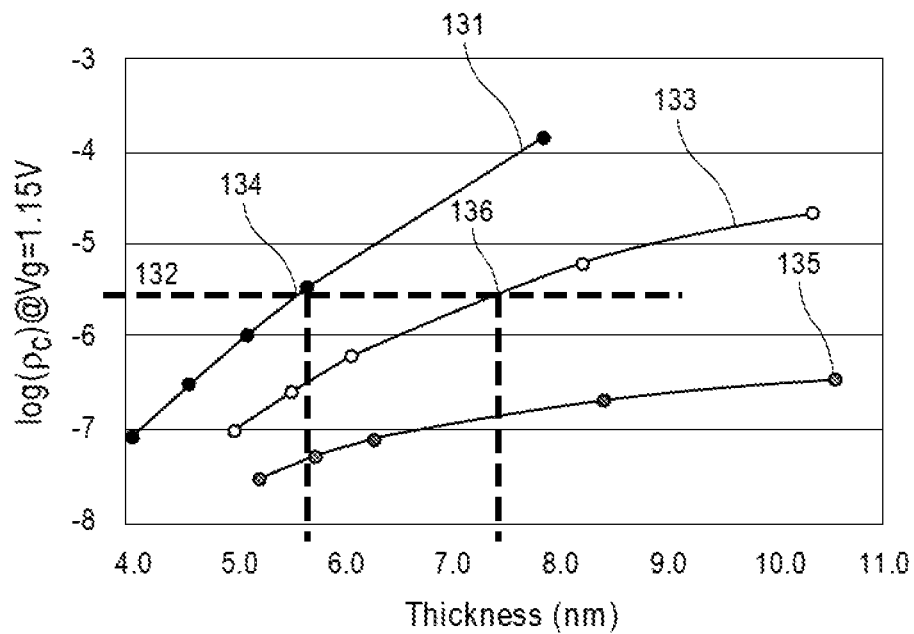

In embodiments, as illustrated in FIG. 1(b), a curve 131 shows a relationship between a thickness of a contact area and a contact resistance at the interface 121 when the Schottky barrier formed at the interface 121 has a first Schottky barrier height. Similarly, a curve 133 or a curve 135 show a relationship between a thickness of a contact area and a contact resistance at the interface 121 when the Schottky barrier formed at the interface 121 has a second or a third Schottky barrier height. For example, the curve 131 may be obtained at a Schottky barrier height of 420 meV, the curve 133 may be obtained at a Schottky barrier height of 270 meV, and the curve 135 may be obtained at a Schottky barrier height of 120 meV. The curve 131, the curve 133, and the curve 135 are plotted using a logarithmic scale fort the contact resistance.

In embodiments, for example, when a contact resistance at the interface 121 is desired to be a value 132, a horizontal line of the value 132 may intersect with the curve 131, the curve 133, or the curve 135. As shown in FIG. 1(b), the horizontal line of the value 132 intersects with the curve 131 at a point 134, which indicates a thickness of about 6.0 nm. Similarly, the horizontal line of the value 132 intersects with the curve 133 at a point 136, which indicates a thickness of about 7.5 nm. The thickness selected based on the curve 131, the curve 133, or the curve 135 may be smaller or thinner than a thickness of a bulk TFT made by the current technologies. In addition, to achieve a same contact resistance at the interface 121, e.g., the value 132, the thickness of a contact area may be reduced from about 7.5 nm to about 6.0 nm when the Schottky barrier height is increased from 270 meV for the curve 133 to 420 meV for the curve 131.

Figure 1C:
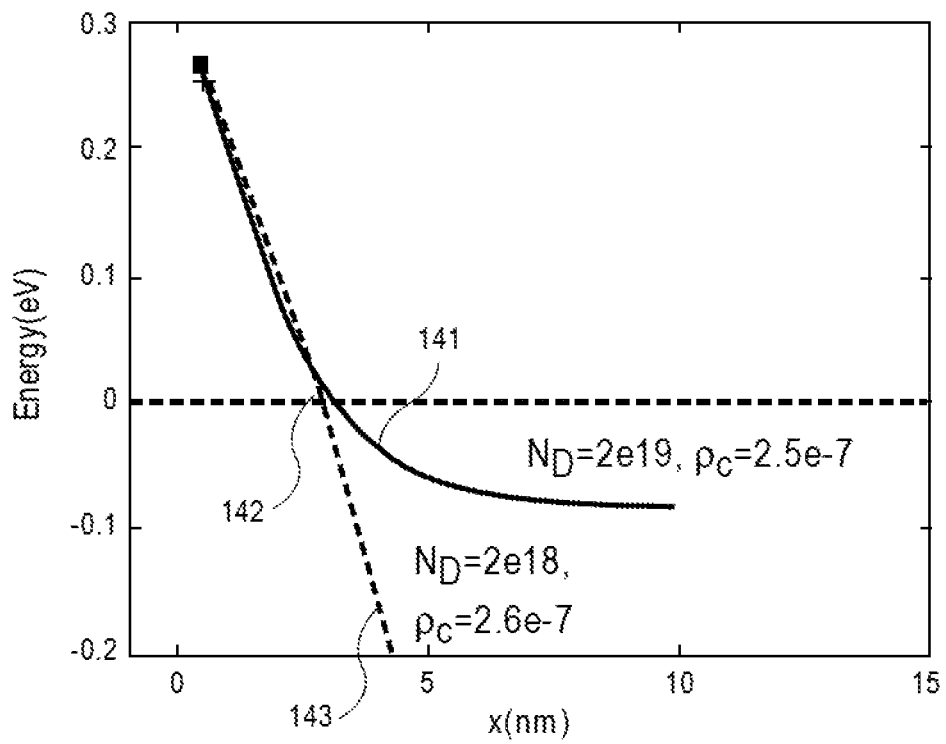

In embodiments, as illustrated in FIG. 1(c), a curve 141 or a curve 143 show a relationship between a thickness x (nm) of a contact area, e.g., the source area 191, and a Schottky barrier height of the Schottky barrier formed at the interface 121, with different doping concentration of the source area 191, and a similar contact resistance at the interface 121. The curve 141 and the curve 143 may be derived based on different formulas, based on a threshold of a thickness of the source area 191. For example, the curve 143 may be derived based on a first formula with respect to a thickness less than 5 nm, which may be a thin body contact area. On the other hand, the curve 141 may be derived based on a second formula with respect to a thickness larger than 10 nm, which may be a bulk contact area, where the second formula is different from the first formula. For both the curve 141 and the curve 143, the contact resistance at the interface 121 is about 2.5e-7. On the other hand, the curve 141 is for a doping concentration $N_D$=2e19, about 10 times higher than a doping concentration $N_D$=2e16 for the curve 143. Hence, a TFT with a thin body contact area, e.g., a thickness around a value 142, may have a similar contact resistance (2.5e-7) as a TFT with a bulk contact area with 10 times higher doping concentration of the contact area.

In embodiments, the channel layer 109 may be an n-type doped channel or a p-type doped channel. The channel layer 109 may include a material such as: $CuS_2$, $CuSe_2$, $WSe_2$, $MoS_2$, $MoSe_2$, $WS_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, or a group-VI transition metal dichalcogenide.

In embodiments, the gate electrode 105, the source electrode 111, or the drain electrode 113, may include a material selected from the group consisting of titanium (T1), molybdenum (Mo), gold (Au), platinum (Pt), aluminum (Al), nickel (Ni), copper (Cu), chromium (Cr), hafnium (Hf), indium (In), and an alloy of T1, Mo, Au, Pt, Al, Ni, Cu, Cr, TiAlN, HfAlN, or InAlO.

In embodiments, the substrate 101 may be a silicon substrate, a glass substrate, such as soda lime glass or borosilicate glass, a metal substrate, a plastic substrate, or another suitable substrate. Other dielectric layer or other devices may be formed on the substrate 101, not shown for clarity.

In embodiments, the ILD layer 103 or the ILD layer 120 may include silicon dioxide ($SiO_2$), carbon doped oxide (CDO), silicon nitride, $O_3$-tetraethylorthosilicate (TEOS), $O_3$-hexamethyldisiloxane (HMDS), plasma-TEOS oxide layer, perfluorocyclobutane, polytetrafluoroethylene, fluorosilicate glass (FSG), organic polymer, silsesquioxane, siloxane, organosilicate glass, or other suitable materials.

In embodiments, the gate dielectric layer 107 may include a high-K dielectric material selected from the group consisting of hafnium silicate, zirconium silicate, hafnium dioxide, zirconium dioxide, aluminum oxide, and nitride hafnium silicate.

FIG. 2 schematically illustrates a diagram of another TFT 210 having a channel layer 209 including a contact area, e.g., a source area 291, with a thickness related a Schottky barrier height of a Schottky barrier formed at an interface between a contact electrode, e.g., a source electrode 211, and the contact area, in accordance with some embodiments. In embodiments, the TFT 210, the channel layer 209, the source area 291, and the source electrode 211 may be an example of the TFT 110, the channel layer 109, the source area 191, and the source electrode 111, as shown in FIG. 1.

In embodiments, an IC 200 includes a substrate 201, an ILD layer 203 above the substrate 201, and the TFT 210 above the substrate 201 and the ILD layer 203. The TFT 210 includes a gate electrode 205 above the substrate 201, a gate dielectric layer 207, the channel layer 209, a passivation layer 215, the source electrode 211, and a drain electrode 213. Either of the source electrode 211 or the drain electrode 213 may be referred to as a contact electrode. The gate electrode 205, the gate dielectric layer 207, the channel layer 209, the source electrode 211, and the drain electrode 213 are within the ILD layer 220 above the substrate 201. The channel layer 209 is above the substrate 201, and separated from the gate electrode 205 by the gate dielectric layer 207. The passivation layer 215 is between the source electrode 211 and the drain electrode 213.

The channel layer 209 includes the source area 291, a channel area 292, and a drain area 293. The source area 291, the channel area 292, or the drain area 293 may be a doped area with a same or different doping concentration. The source area 291 may have a thickness T21, the channel area 292 may have a thickness T22, and the drain area 293 may have a thickness T23. In some embodiments, the channel layer 209 may have the channel area 292 with the thickness T22 that is larger than the thickness of the contact area of the channel layer, the thickness T21 of the source area 291, or the thickness T23 of the drain area 293.

In embodiments, the source electrode 211 is in contact with the source area 291 of the channel layer 209, and the drain electrode 213 is in contact with the drain area 293 of the channel layer 209. The source electrode 211 may have a height H21, and the drain electrode 213 may have a height H23. In some embodiments, the source area 291 may have the thickness T21 smaller than the height H21 of the source electrode 211, and the drain area 293 may have the thickness T23 smaller than the height H23 of the drain electrode 213.

In embodiments, a Schottky barrier is formed at an interface 221 between the source electrode 211 and the source area 291. Similarly, a Schottky barrier is formed at an interface 223 between the drain electrode 213 and the drain area 293. A contact resistance exists at the interface 221 between the source electrode 211 and the source area 291. A contact resistance exists at the interface 223 between the drain electrode 213 and the drain area 293. In designing the TFT 210, the thickness T21 of the source area 291 may be determined based on a Schottky barrier height of the Schottky barrier formed at the interface 221, a doping concentration of the source area 291, and a contact resistance at the interface 221. Similarly, the thickness T23 of the drain area 293 may be determined based on a Schottky barrier height of the Schottky barrier formed at the interface 223, a doping concentration of the drain area 293, and a contact resistance at the interface 223.

Figure 3:
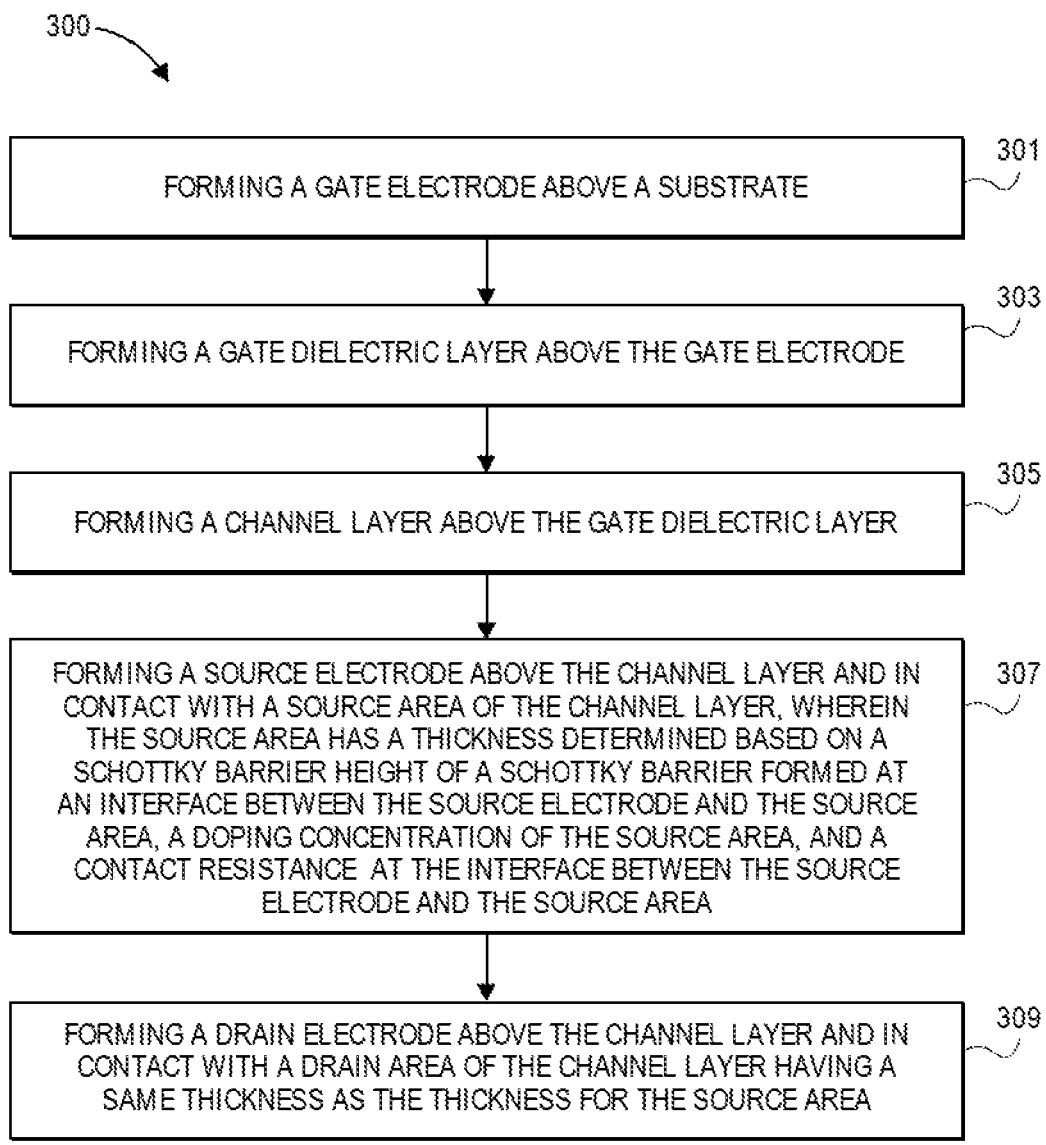
FIG. 3 illustrates a process for forming a TFT having a channel layer including a contact area with a thickness related a Schottky barrier height of a Schottky barrier formed at an interface between a contact electrode and the contact area, in accordance with some embodiments.

FIG. 3 illustrates a process 300 for forming a TFT having a channel layer including a contact area with a thickness related a Schottky barrier height of a Schottky barrier formed at an interface between a contact electrode and the contact area, in accordance with some embodiments. In embodiments, the process 300 may be applied to form the TFT 110 having the channel layer 109, the source area 191, and the source electrode 111, as shown in FIG. 1; or the TFT 210 having the channel layer 209, the source area 291, and the source electrode 211, as shown in FIG. 2.

At block 301, the process 300 may include forming a gate electrode above a substrate. For example, the process 300 may include forming the gate electrode 105 above the substrate 101, as shown in FIG. 1(a).

At block 303, the process 300 may include forming a gate dielectric layer above the gate electrode. For example, the process 300 may include forming the gate dielectric layer 107 above the gate electrode 105, as shown in FIG. 1(a).

At block 305, the process 300 may include forming a channel layer above the gate dielectric layer. For example, the process 300 may include forming the channel layer 109 above the gate dielectric layer 107, as shown in FIG. 1(a).

At block 307, the process 300 may include forming a source electrode above the channel layer and in contact with a source area of the channel layer, wherein the source area has a thickness determined based on a Schottky barrier height of a Schottky barrier formed at an interface between the source electrode and the source area, a doping concentration of the source area, and a contact resistance at the interface between the source electrode and the source area. For example, the process 300 may include forming the source electrode 111 above the channel layer 109 and in contact with the source area 191. The source area 191 has the thickness T1 determined based on a Schottky barrier height of a Schottky barrier formed at the interface 121 between the source electrode 111 and the source area 191, a doping concentration of the source area 191, and a contact resistance at the interface between the source electrode 111 and the source area 191, as shown in FIG. 1(a).

At block 309, the process 300 may include forming a drain electrode above the channel layer and in contact with a drain area of the channel layer having a same thickness as the thickness for the source area. For example, the process 300 may include forming the drain electrode 113 above the channel layer 109 and in contact with the drain area 193 having a thickness T3 that is a same as the thickness T1 for the source area 191, as shown in FIG. 1(a).

In addition, the process 300 may include additional operations to form other layers, e.g., ILD layers, encapsulation layers, insulation layers, not shown.

Figure 4:
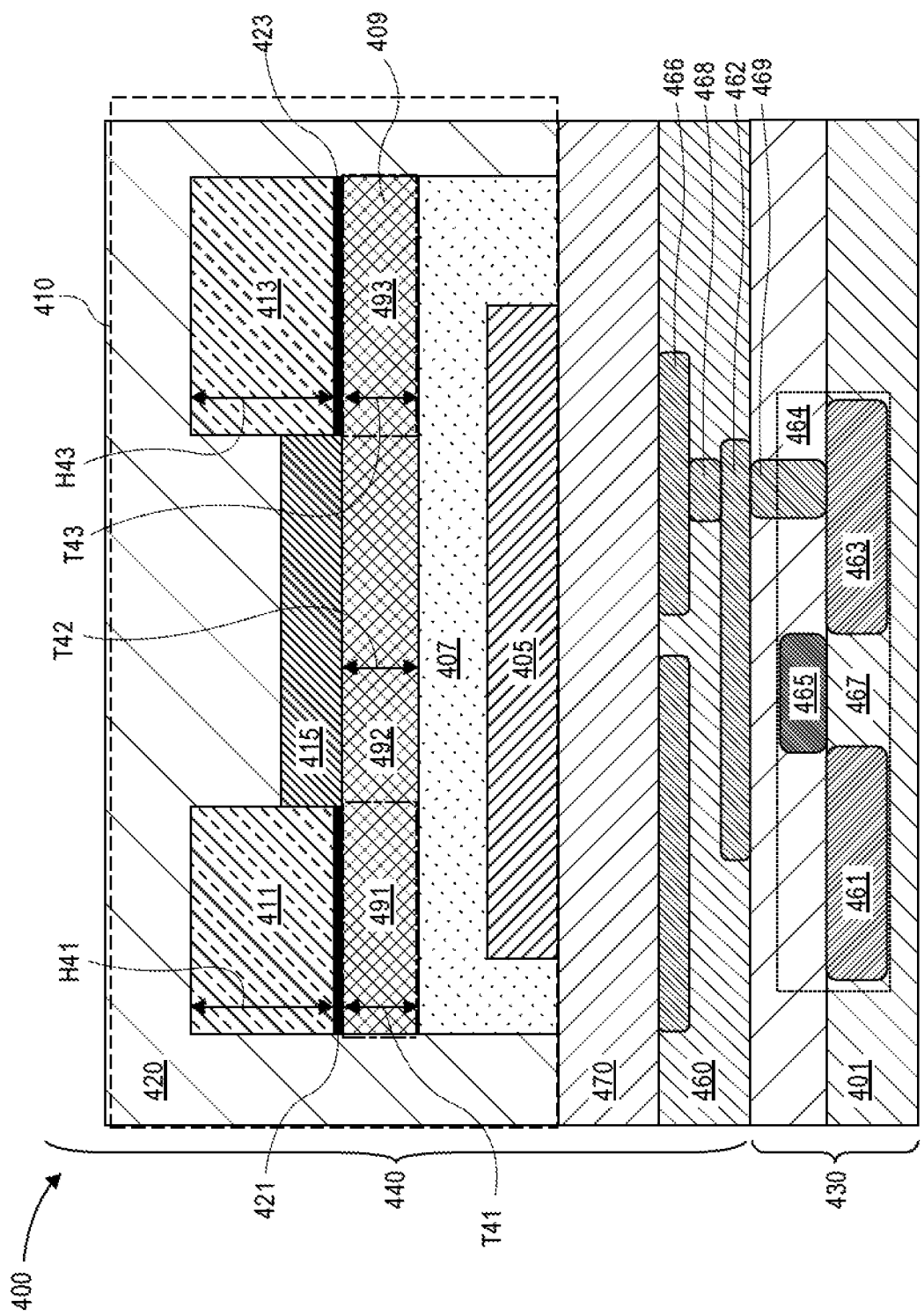
FIG. 4 schematically illustrates a diagram of TFT having a channel layer including a contact area with a thickness related a Schottky barrier height of a Schottky barrier formed at an interface between a contact electrode and the contact area, and formed in back-end-of-line (BEOL) on a substrate, in accordance with some embodiments.

FIG. 4 schematically illustrates a diagram of TFT 410 having a channel layer 409 including a contact area, e.g., a source area 491, with a thickness related a Schottky barrier height of a Schottky barrier formed at an interface between a contact electrode, e.g., a source electrode 411, and the contact area, and formed in back-end-of-line (BEOL) on a substrate 401, in accordance with some embodiments. The TFT 410 may be an example of the TFT 110 in FIG. 1(a), or the TFT 210 in FIG. 2. Various layers in the TFT 410 may be similar to corresponding layers in the TFT 110 in FIG. 1(a), or the TFT 210 in FIG. 2.

In embodiments, an IC 400 includes a substrate 401, and the TFT 410 above the substrate 401. The TFT 410 includes a gate electrode 405 above the substrate 401, a gate dielectric layer 407, the channel layer 409, a passivation layer 415, the source electrode 411, and a drain electrode 413. Either of the source electrode 411 or the drain electrode 413 may be referred to as a contact electrode. The gate electrode 405, the gate dielectric layer 407, the channel layer 409, the source electrode 411, and the drain electrode 413 are within the ILD layer 420 above the substrate 401. The channel layer 409 is above the substrate 401, and separated from the gate electrode 405 by the gate dielectric layer 407. The passivation layer 415 is between the source electrode 411 and the drain electrode 413.

The channel layer 409 includes the source area 491, a channel area 492, and a drain area 493. The source area 491, the channel area 492, or the drain area 493 may be a doped area with a same or different doping concentration. The source area 491 may have a thickness T41, the channel area 492 may have a thickness T42, and the drain area 493 may have a thickness T43. In some embodiments, the channel layer 409 may have the channel area 492 with the thickness T42 that is same as the thickness of the contact area of the channel layer, the thickness T41 of the source area 491, or the thickness T43 of the drain area 493.

In embodiments, the source electrode 411 is in contact with the source area 491 of the channel layer 409, and the drain electrode 413 is in contact with the drain area 493 of the channel layer 409. The source electrode 411 may have a height H41, and the drain electrode 413 may have a height H43. In some embodiments, the source area 491 may have the thickness T41 smaller than the height H41 of the source electrode 411, and the drain area 493 may have the thickness T43 smaller than the height H43 of the drain electrode 413.

In embodiments, a Schottky barrier is formed at an interface 421 between the source electrode 411 and the source area 491. Similarly, a Schottky barrier is formed at an interface 423 between the drain electrode 413 and the drain area 493. A contact resistance exists at the interface 421 between the source electrode 411 and the source area 491. A contact resistance exists at the interface 423 between the drain electrode 413 and the drain area 493. In designing the TFT 410, the thickness T41 of the source area 491 may be determined based on a Schottky barrier height of the Schottky barrier formed at the interface 421, a doping concentration of the source area 491, and a contact resistance at the interface 421. Similarly, the thickness T43 of the drain area 493 may be determined based on a Schottky barrier height of the Schottky barrier formed at the interface 423, a doping concentration of the drain area 493, and a contact resistance at the interface 423.

In embodiments, the TFT 410 may be formed at the BEOL 440. In addition to the TFT 410, the BEOL 440 may further include a dielectric layer 460 and a dielectric layer 470. One or more vias, e.g., a via 468, may be connected to one or more interconnect, e.g., an interconnect 466, and an interconnect 462 within the dielectric layer 460. In embodiments, the interconnect 466 and the interconnect 462 may be of different metal layers at the BEOL 440. The dielectric layer 460 is shown for example only. Although not shown by FIG. 4, in various embodiments there may be multiple dielectric layers included in the BEOL 440.

In embodiments, the BEOL 440 may be formed on the front-end-of-line (FEOL) 430. The FEOL 430 may include the substrate 401. In addition, the FEOL 430 may include other devices, e.g., a transistor 464. In embodiments, the transistor 464 may be a FEOL transistor, including a source 461, a drain 463, and a gate 465, with a channel 467 between the source 461 and the drain 463 under the gate 465. Furthermore, the transistor 464 may be coupled to interconnects, e.g., the interconnect 462, through a via 469.

Figure 5:
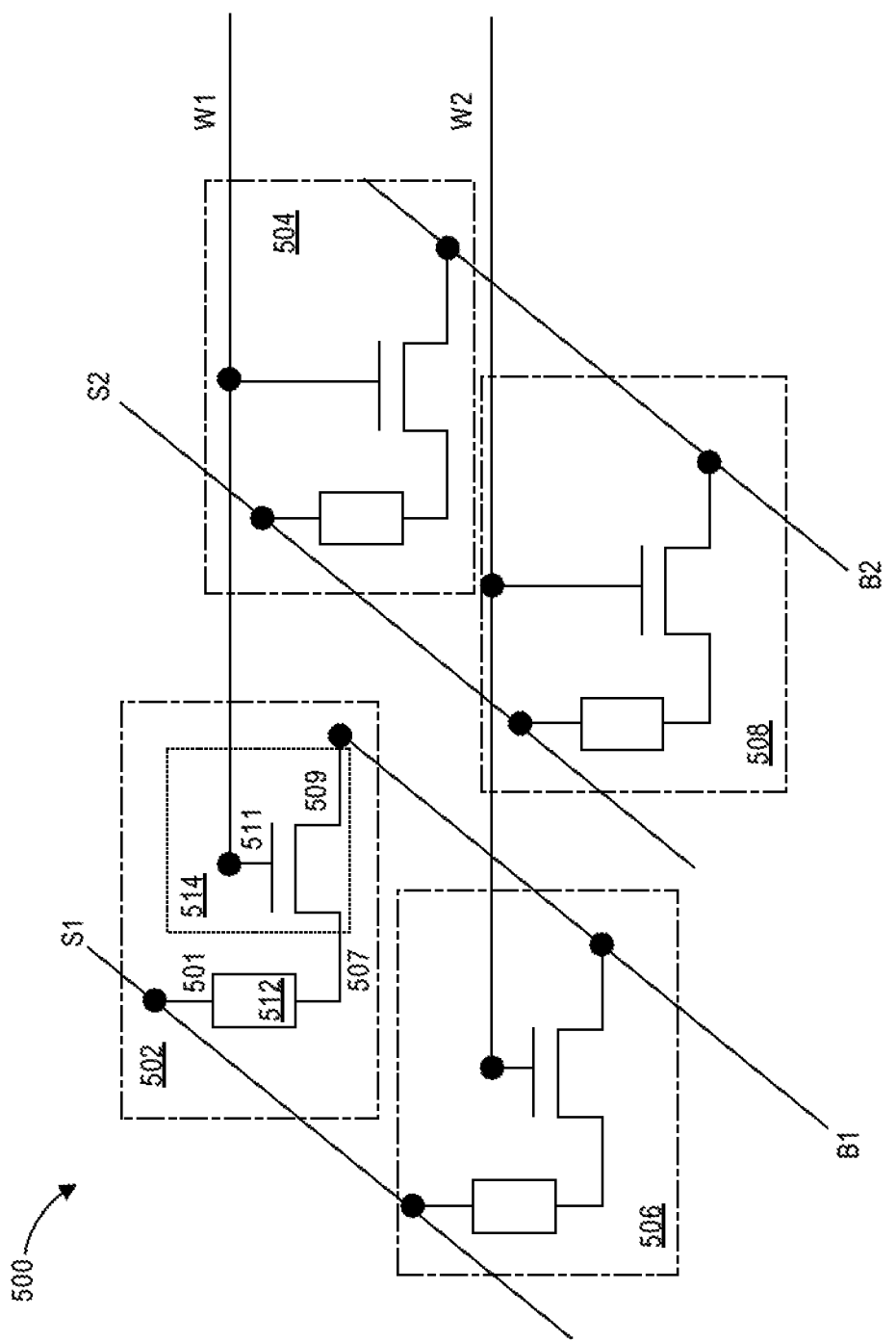
FIG. 5 schematically illustrates a memory array with multiple memory cells, where a TFT may be a selector of a memory cell, in accordance with some embodiments.

FIG. 5 schematically illustrates a memory array 500 with multiple memory cells (e.g., a memory cell 502, a memory cell 504, a memory cell 506, and a memory cell 508), where a TFT, e.g., a TFT 514, may be a selector of a memory cell, e.g., the memory cell 502, in accordance with various embodiments. In embodiments, the TFT 514 may be an example of the TFT 110 in FIG. 1(a), the TFT 210 in FIG. 2, or the TFT 410 in FIG. 4. The TFT 514 may include a gate electrode 511 coupled to a word line W1.

In embodiments, the multiple memory cells may be arranged in a number of rows and columns coupled by bit lines, e.g., bit line B1 and bit line B2, word lines, e.g., word line W1 and word line W2, and source lines, e.g., source line S1 and source line S2. The memory cell 502 may be coupled in series with the other memory cells of the same row, and may be coupled in parallel with the memory cells of the other rows. The memory array 500 may include any suitable number of one or more memory cells.

In embodiments, multiple memory cells, such as the memory cell 502, the memory cell 504, the memory cell 506, and the memory cell 508, may have a similar configuration. For example, the memory cell 502 may include the TFT 514 coupled to a storage cell 512 that may be a capacitor, which may be called a 1T1C configuration. The memory cell 502 may be controlled through multiple electrical connections to read from the memory cell, write to the memory cell, and/or perform other memory operations. In some embodiments, the storage cell 512 may be another type of storage device, e.g., a resistive random access memory (RRAM) cell.

The TFT 514 may be a selector for the memory cell 502. A word line W1 of the memory array 500 may be coupled to a gate electrode 511 of the TFT 514. When the word line W1 is active, the TFT 514 may select the storage cell 512. A source line S1 of the memory array 500 may be coupled to an electrode 501 of the storage cell 512, while another electrode 507 of the storage cell 512 may be shared with the TFT 514. In addition, a bit line B1 of the memory array 500 may be coupled to another electrode, e.g., an electrode 509 of the TFT 514. The shared electrode 507 may be a source electrode or a drain electrode of the TFT 514, while the electrode 509 may be a drain electrode or a source electrode of the TFT 514. A drain electrode and a source electrode may be used interchangeably herein. Additionally, a source line and a bit line may be used interchangeably herein.

In various embodiments, the memory cells and the transistors, e.g., the memory cell 502 and the TFT 514, included in the memory array 500 may be formed in BEOL, as shown in FIG. 4. For example, the TFT 514 may be illustrated as the TFT 410 shown in FIG. 4 at the BEOL. Accordingly, the memory array 500 may be formed in higher metal layers, e.g., metal layer 3 and/or metal layer 4, of the integrated circuit above the active substrate region, and may not occupy the active substrate area that is occupied by conventional transistors or memory devices.

Figure 6:
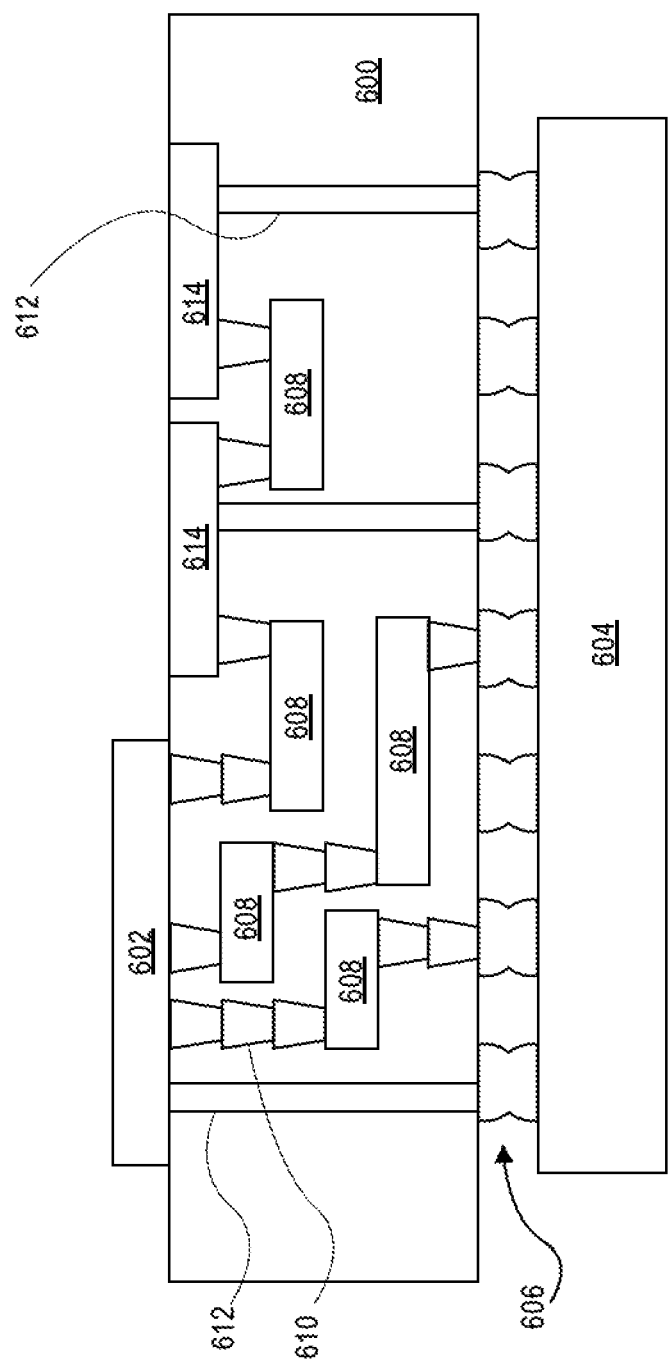
FIG. 6 schematically illustrates an interposer implementing one or more embodiments of the disclosure, in accordance with some embodiments.

FIG. 6 illustrates an interposer 600 that includes one or more embodiments of the disclosure. The interposer 600 is an intervening substrate used to bridge a first substrate 602 to a second substrate 604. The first substrate 602 may be, for instance, a substrate support for a TFT, e.g., the TFT 110 shown in FIG. 1(a), the TFT 210 shown in FIG. 2, or the TFT 410 shown in FIG. 4. The second substrate 604 may be, for instance, a memory module, a computer motherboard, or another integrated circuit die. For example, the second substrate 604 may be a memory module including the memory array 500 as shown in FIG. 5. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the disclosure, apparatuses or processes disclosed herein may be used in the fabrication of interposer 600.

Figure 7:
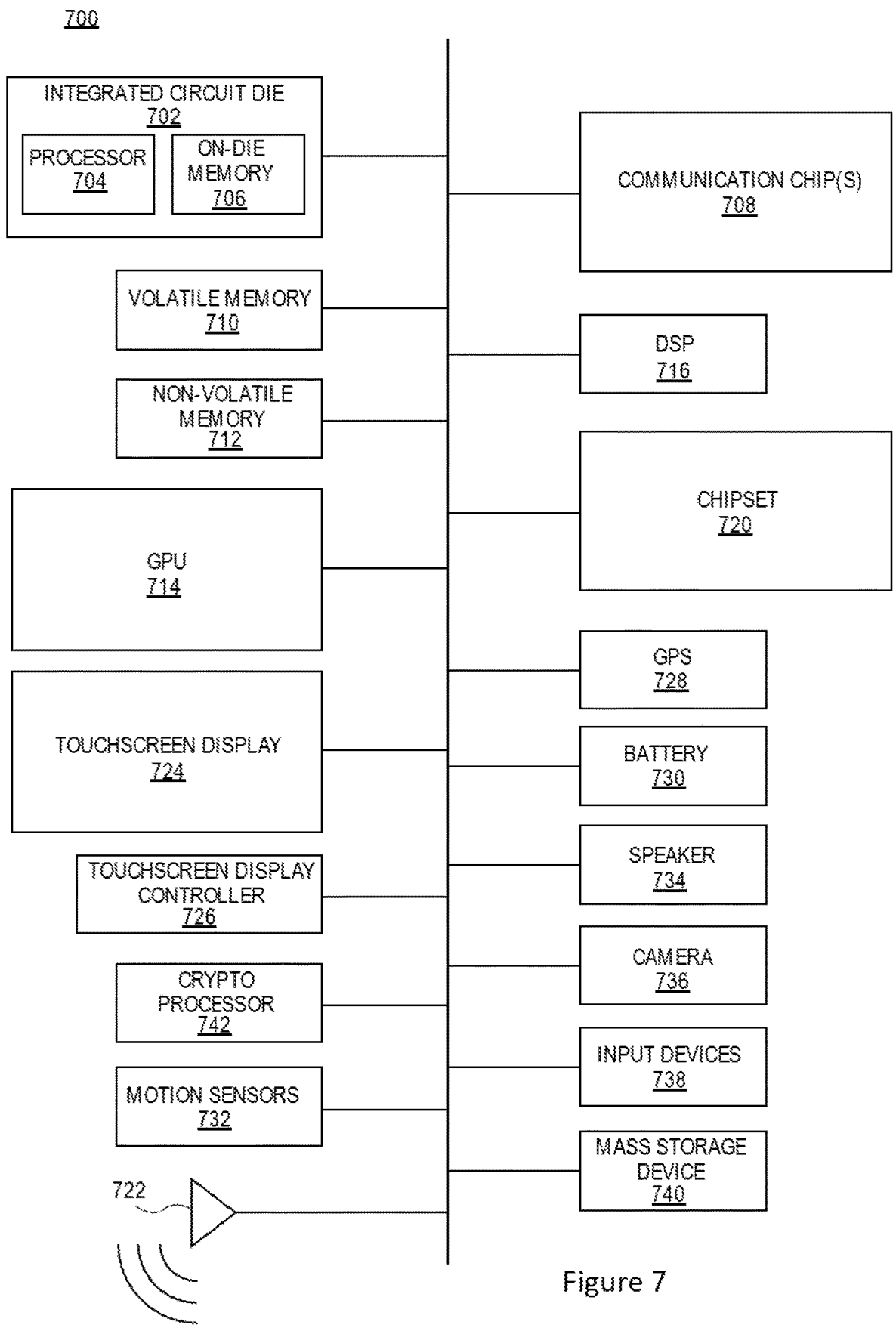
FIG. 7 schematically illustrates a computing device built in accordance with an embodiment of the disclosure, in accordance with some embodiments.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a processor 704 as well as on-die memory 706, often used as cache memory, which can be provided by technologies such as embedded DRAM (eDRAM), or SRAM. For example, the on-die memory 706 may include the TFT 110 shown in FIG. 1(a), the TFT 210 shown in FIG. 2, the TFT 410 shown in FIG. 4, or a TFT formed according to the process 300 shown in FIG. 3.

In embodiments, the computing device 700 may include a display or a touchscreen display 724, and a touchscreen display controller 726. A display or the touchscreen display 724 may include a FPD, an AMOLED display, a TFT LCD, a micro light-emitting diode (µLED) display, or others. For example, the touchscreen display 724 may include the TFT 110 shown in FIG. 1(a), the TFT 210 shown in FIG. 2, the TFT 410 shown in FIG. 4, or a TFT formed according to the process 300 shown in FIG. 3.

Computing device 700 may include other components that may or may not be physically and electrically coupled to the motherboard or fabricated within a SoC die. These other components include, but are not limited to, volatile memory 710 (e.g., dynamic random access memory (DRAM), non-volatile memory 712 (e.g., ROM or flash memory), a graphics processing unit 714 (GPU), a digital signal processor (DSP) 716, a crypto processor 742 (e.g., a specialized processor that executes cryptographic algorithms within hardware), a chipset 720, at least one antenna 722 (in some implementations two or more antenna may be used), a battery 730 or other power source, a power amplifier (not shown), a voltage regulator (not shown), a global positioning system (GPS) device 728, a compass, a motion coprocessor or sensors 732 (that may include an accelerometer, a gyroscope, and a compass), a microphone (not shown), a speaker 734, a camera 736, user input devices 738 (such as a keyboard, mouse, stylus, and touchpad), and a mass storage device 740 (such as hard disk drive, compact disk (CD), digital versatile disk (DVD), and so forth). The computing device 700 may incorporate further transmission, telecommunication, or radio functionality not already described herein. In some implementations, the computing device 700 includes a radio that is used to communicate over a distance by modulating and radiating electromagnetic waves in air or space. In further implementations, the computing device 700 includes a transmitter and a receiver (or a transceiver) that is used to communicate over a distance by modulating and radiating electromagnetic waves in air or space.

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi, NFC, and Bluetooth and a second communications logic unit 708 may be dedicated to longer range wireless communications such as GPS, EDGE, GPRS, CDMA, WiMAX, LTE, Ev-DO, and others.

The processor 704 of the computing device 700 includes one or more devices, such as transistors. The term "processor" may refer to any device or portion of a device that processes electronic data from registers and/or memory to transform that electronic data into other electronic data that may be stored in registers and/or memory. The communications logic unit 708 may also include one or more devices, such as transistors.

In further embodiments, another component housed within the computing device 700 may contain one or more devices, such as DRAM, that are formed in accordance with implementations of the current disclosure, e.g., the TFT 110 shown in FIG. 1(*a*), the TFT 210 shown in FIG. 2, the TFT 410 shown in FIG. 4, or a TFT formed according to the process 300 shown in FIG. 3.

In various embodiments, the computing device 700 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some non-limiting Examples are provided below.

Example 1 may include a semiconductor device, comprising: a substrate; a transistor above the substrate, wherein the transistor includes: a gate electrode above the substrate; a channel layer above the substrate, separated from the gate electrode by a gate dielectric layer; and a contact electrode above the channel layer and in contact with a contact area of the channel layer, wherein the contact area of the channel layer has a thickness determined based on a Schottky barrier height of a Schottky barrier formed at an interface between the contact electrode and the contact area, a doping concentration of the contact area of the channel layer, and a contact resistance at the interface between the contact electrode and the contact area of the channel layer.

Example 2 may include the semiconductor device of example 1 and/or some other examples herein, wherein the contact electrode is a source electrode or a drain electrode.

Example 3 may include the semiconductor device of example 1 and/or some other examples herein, wherein the channel layer is a n-type doped channel or a p-type doped channel.

Example 4 may include the semiconductor device of example 1 and/or some other examples herein, wherein the channel layer has a thickness throughout the channel layer that is same as the thickness of the contact area of the channel layer.

Example 5 may include the semiconductor device of example 1 and/or some other examples herein, wherein the channel layer has a channel area with a thickness that is larger than the thickness of the contact area of the channel layer.

Example 6 may include the semiconductor device of example 1 and/or some other examples herein, wherein the thickness of the contact area of the channel layer is smaller than a height of the contact electrode.

Example 7 may include the semiconductor device of example 6 and/or some other examples herein, wherein the thickness of the contact area of the channel layer is in a range of about 1 nm to about 10 nm, and the height of the contact electrode is higher than 10 nm.

Example 8 may include the semiconductor device of example 1 and/or some other examples herein, wherein the channel layer is above the gate electrode, and the gate dielectric layer is above the gate electrode and below the channel layer.

Example 9 may include the semiconductor device of example 1 and/or some other examples herein, further comprising: the gate dielectric layer between the channel layer and the gate electrode, wherein the gate dielectric layer includes silicon and oxygen; silicon and nitrogen; yttrium and oxygen; silicon, oxygen, and nitrogen; aluminum and oxygen; hafnium and oxygen; tantalum and oxygen; or titanium and oxygen.

Example 10 may include the semiconductor device of example 1 and/or some other examples herein, wherein the channel layer includes a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Example 11 may include the semiconductor device of example 1 and/or some other examples herein, wherein the gate electrode or the contact electrode includes a material selected from the group consisting of titanium (T1), molybdenum (Mo), gold (Au), platinum (Pt), aluminum (Al), nickel (Ni), copper (Cu), chromium (Cr), hafnium (Hf), indium (In), W, Mo, Ta, and an alloy of T1, Mo, Au, Pt, Al, Ni, Cu, Cr, TiAlN, HfAlN, or InAlO.

Example 12 may include the semiconductor device of example 1 and/or some other examples herein, wherein the substrate includes a silicon substrate, a glass substrate, a metal substrate, or a plastic substrate.

Example 13 may include the semiconductor device of example 1 and/or some other examples herein, wherein the transistor is above an interconnect that is above the substrate.

Example 14 may include a method for forming a vertical thin film transistor (TFT), the method comprising: forming a gate electrode above a substrate; forming a channel layer above the gate electrode and separated from the gate electrode by a gate dielectric layer; forming a contact electrode above the channel layer and in contact with a contact area of the channel layer, wherein the contact area of the channel layer has a thickness determined based on a Schottky barrier height of a Schottky barrier formed at an interface between the contact electrode and the contact area, a doping concentration of the contact area of the channel layer, and a contact resistance at the interface between the contact electrode and the contact area of the channel layer.

Example 15 may include the method of example 14 and/or some other examples herein, further comprising: forming the gate dielectric layer between the channel layer and the gate electrode.

Example 16 may include the method of example 14 and/or some other examples herein, wherein the contact electrode is source electrode in contact with a first contact area of the channel layer, and the method further comprises: forming a drain electrode above the channel layer and in contact with a second contact area of the channel layer having a same thickness as the thickness for the first contact area.

Example 17 may include the method of example 14 and/or some other examples herein, wherein the channel layer has a thickness throughout the channel layer that is same as the thickness of the contact area of the channel layer.

Example 18 may include the method of example 14 and/or some other examples herein, wherein the channel layer has a channel area with a thickness that is larger than the thickness of the contact area of the channel layer.

Example 19 may include the method of example 14 and/or some other examples herein, wherein the thickness of the contact area of the channel layer is smaller than a height of the contact electrode.

Example 20 may include the method of example 19 and/or some other examples herein, wherein the thickness of the contact area of the channel layer is in a range of about 1 nm to about 10 nm, and the height of the contact electrode is higher than 10 nm.

Example 21 may include the method of example 14 and/or some other examples herein, wherein the gate electrode, or the contact electrode includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), Mg, W, Fe, Vn, Zn, Ta, Mo, and an alloy of Ti, Mo, Au, Pt, Al, Ni, Cu, Cr, TiAlN, HfAlN, or InAlO.

Example 22 may include a computing device, comprising: a circuit board; and a memory device coupled to the circuit board and including a memory array, wherein the memory array includes a plurality of memory cells, a memory cell of the plurality of memory cells includes a transistor and a storage cell, and wherein the transistor includes: a gate electrode above a substrate and coupled to a word line of the memory array; a channel layer above the substrate, separated from the gate electrode by a gate dielectric layer; a source electrode in contact with a source area of the channel layer, and coupled to a bit line of the memory array, wherein the source area of the channel layer has a source area thickness determined based on a Schottky barrier height of a Schottky barrier formed at an interface between the source electrode and the source area of the channel layer, a doping concentration of the source area of the channel layer, and a contact resistance at the interface between the source electrode and the source area of the channel layer; a drain electrode in contact with a drain area of the channel layer, and coupled to a first electrode of the storage cell, wherein the drain area has a drain area thickness that is same as the source area thickness; and the storage cell further includes a second electrode coupled to a source line of the memory array.

Example 23 may include computing device of example 22 and/or some other examples herein, wherein the channel layer has a thickness throughout the channel layer that is same as the source area thickness.

Example 24 may include computing device of example 22 and/or some other examples herein, wherein the channel layer has a channel area with a thickness that is larger than the source area thickness.

Example 25 may include computing device of example 22 and/or some other examples herein, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a substrate;
   a transistor above the substrate, wherein the transistor includes:
     a gate electrode above the substrate;
     a channel layer above the substrate, separated from the gate electrode by a gate dielectric layer; and
     a contact electrode above the channel layer and in contact with a contact area of the channel layer, wherein the contact area of the channel layer has a thickness determined based on a Schottky barrier height of a Schottky barrier formed at an interface between the contact electrode and the contact area, a doping concentration of the contact area of the channel layer, and a contact resistance at the interface between the contact electrode and the contact area of the channel layer.

2. The semiconductor device of claim 1, wherein the contact electrode is a source electrode or a drain electrode.

3. The semiconductor device of claim 1, wherein the channel layer is a n-type doped channel or a p-type doped channel.

4. The semiconductor device of claim 1, wherein the channel layer has a thickness throughout the channel layer that is same as the thickness of the contact area of the channel layer.

5. The semiconductor device of claim 1, wherein the channel layer has a channel area with a thickness that is larger than the thickness of the contact area of the channel layer.

6. The semiconductor device of claim 1, wherein the thickness of the contact area of the channel layer is smaller than a height of the contact electrode.

7. The semiconductor device of claim 6, wherein the thickness of the contact area of the channel layer is in a range of about 1 nm to about 10 nm, and the height of the contact electrode is higher than 10 nm.

8. The semiconductor device of claim 1, wherein the channel layer is above the gate electrode, and the gate dielectric layer is above the gate electrode and below the channel layer.

9. The semiconductor device of claim 1, further comprising:
the gate dielectric layer between the channel layer and the gate electrode, wherein the gate dielectric layer includes silicon and oxygen; silicon and nitrogen; yttrium and oxygen; silicon, oxygen, and nitrogen; aluminum and oxygen; hafnium and oxygen; tantalum and oxygen; or titanium and oxygen.

10. The semiconductor device of claim 1, wherein the channel layer includes a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

11. The semiconductor device of claim 1, wherein the gate electrode or the contact electrode includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), W, Mo, Ta, and an alloy of Ti, Mo, Au, Pt, Al, Ni, Cu, Cr, TiAlN, HfAlN, or InAlO.

12. The semiconductor device of claim 1, wherein the substrate includes a silicon substrate, a glass substrate, a metal substrate, or a plastic substrate.

13. The semiconductor device of claim 1, wherein the transistor is above an interconnect that is above the substrate.

14. A method for forming a vertical thin film transistor (TFT), the method comprising:
forming a gate electrode above a substrate;
forming a channel layer above the gate electrode and separated from the gate electrode by a gate dielectric layer;
forming a contact electrode above the channel layer and in contact with a contact area of the channel layer, wherein the contact area of the channel layer has a thickness determined based on a Schottky barrier height of a Schottky barrier formed at an interface between the contact electrode and the contact area, a doping concentration of the contact area of the channel layer, and a contact resistance at the interface between the contact electrode and the contact area of the channel layer.

15. The method of claim 14, further comprising:
forming the gate dielectric layer between the channel layer and the gate electrode.

16. The method of claim 14, wherein the contact electrode is source electrode in contact with a first contact area of the channel layer, and the method further comprises:
forming a drain electrode above the channel layer and in contact with a second contact area of the channel layer having a same thickness as the thickness for the first contact area.

17. The method of claim 14, wherein the channel layer has a thickness throughout the channel layer that is same as the thickness of the contact area of the channel layer.

18. The method of claim 14, wherein the channel layer has a channel area with a thickness that is larger than the thickness of the contact area of the channel layer.

19. The method of claim 14, wherein the thickness of the contact area of the channel layer is smaller than a height of the contact electrode.

20. The method of claim 19, wherein the thickness of the contact area of the channel layer is in a range of about 1 nm to about 10 nm, and the height of the contact electrode is higher than 10 nm.

21. The method of claim 14, wherein the gate electrode, or the contact electrode includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), Mg, W, Fe, Vn, Zn, Ta, Mo, and an alloy of Ti, Mo, Au, Pt, Al, Ni, Cu, Cr, TiAlN, HfAlN, or InAlO.

22. A computing device, comprising:
a circuit board; and
a memory device coupled to the circuit board and including a memory array, wherein the memory array includes a plurality of memory cells, a memory cell of the plurality of memory cells includes a transistor and a storage cell, and wherein the transistor includes:
a gate electrode above a substrate and coupled to a word line of the memory array;
a channel layer above the substrate, separated from the gate electrode by a gate dielectric layer;
a source electrode in contact with a source area of the channel layer, and coupled to a bit line of the memory array, wherein the source area of the channel layer has a source area thickness determined based on a Schottky barrier height of a Schottky barrier formed at an interface between the source electrode and the source area of the channel layer, a doping concentration of the source area of the channel layer, and a contact resistance at the interface between the source electrode and the source area of the channel layer;

a drain electrode in contact with a drain area of the channel layer, and coupled to a first electrode of the storage cell, wherein the drain area has a drain area thickness that is same as the source area thickness; and the storage cell further includes a second electrode coupled to a source line of the memory array.

23. The computing device of claim 22, wherein the channel layer has a thickness throughout the channel layer that is same as the source area thickness.

24. The computing device of claim 22, wherein the channel layer has a channel area with a thickness that is larger than the source area thickness.

25. The computing device of claim 22, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

* * * * *